(12) United States Patent
Willemin et al.

(10) Patent No.: US 9,742,219 B2
(45) Date of Patent: Aug. 22, 2017

(54) CIRCUIT FOR COMPARING A VOLTAGE WITH A THRESHOLD

(71) Applicants: Commissariat à l'Énergie Atomique et aux Énergies Alternatives, Paris (FR); STMicroelectronics SAS, Rousset (FR)

(72) Inventors: Jérôme Willemin, Tullins (FR); Sébastien Boisseau, Grenoble (FR); Séverin Trochut, Gilly sur Isere (FR); Stéphane Monfray, Eybens (FR)

(73) Assignees: Commissariat à l'Énergie Atomique et aux Énergies Alternatives, Paris (FR); STMicroelectronics SA, Montrouge (FR)

( * ) Notice: Subject to any disclaimer, the term of this patent is extended or adjusted under 35 U.S.C. 154(b) by 126 days.

(21) Appl. No.: 14/970,329

(22) Filed: Dec. 15, 2015

(65) Prior Publication Data
US 2016/0172898 A1    Jun. 16, 2016

(30) Foreign Application Priority Data
Dec. 15, 2014  (FR) ...................... 14 62427

(51) Int. Cl.
*H02J 7/00*    (2006.01)
*H02J 7/34*    (2006.01)
(Continued)

(52) U.S. Cl.
CPC .......... *H02J 7/345* (2013.01); *G01R 19/0084* (2013.01); *G01R 19/16519* (2013.01);
(Continued)

(58) Field of Classification Search
CPC ........... H02J 7/345; H02M 2001/0022; H02M 3/156; H02N 2/181; G01R 19/0084;
(Continued)

(56) References Cited

U.S. PATENT DOCUMENTS

| 5,952,870 A | 9/1999 | Urban |
| 6,259,292 B1 * | 7/2001 | Congdon ............. H03K 3/2893 323/282 |

(Continued)

FOREIGN PATENT DOCUMENTS

| EP | 2323015 A2 | 5/2011 |
| GB | 1134230 A | 11/1968 |

OTHER PUBLICATIONS

French search report, dated Aug. 5, 2015, from corresponding French Application No. 14/62427.

*Primary Examiner* — Nathaniel Pelton
(74) *Attorney, Agent, or Firm* — Wolf, Greenfield & Sacks, P.C.

(57) ABSTRACT

A circuit for comparing a voltage with a threshold, including: first and second nodes of application of the voltage; a first branch including a first transistor series-connected with a first resistor between first and second nodes; a second branch parallel to the first branch, including second and third series-connected resistors forming a voltage dividing bridge between the first and second nodes, the midpoint of the dividing bridge being connected to a control node of the first transistor; and a third branch including a second transistor in series with a resistive and/or capacitive element, between the control node of the first transistor and the first or second node, a control node of the second transistor being connected to the junction point of the first transistor and of the first resistor.

14 Claims, 4 Drawing Sheets

(51) Int. Cl.
*G01R 19/00* (2006.01)
*G01R 19/165* (2006.01)
*H02N 2/18* (2006.01)
*H03K 3/021* (2006.01)
*H03K 3/2893* (2006.01)
*H03K 3/3565* (2006.01)
*H03K 17/30* (2006.01)
*H02M 3/156* (2006.01)
*H02M 1/00* (2006.01)

(52) U.S. Cl.
CPC . *G01R 19/16538* (2013.01); *G01R 19/16576* (2013.01); *H02M 3/156* (2013.01); *H02N 2/181* (2013.01); *H03K 3/021* (2013.01); *H03K 3/2893* (2013.01); *H03K 3/3565* (2013.01); *H03K 17/302* (2013.01); *H02M 2001/0022* (2013.01); *H03K 2217/0036* (2013.01)

(58) Field of Classification Search
CPC ........ G01R 19/16519; G01R 19/16538; G01R 19/16576; H03K 17/302; H03K 2217/0036; H03K 3/021; H03K 3/2893; H03K 3/3565
USPC .......................................... 320/101; 324/426
See application file for complete search history.

(56) References Cited

U.S. PATENT DOCUMENTS

| | | | |
|---|---|---|---|
| 6,310,497 B1* | 10/2001 | Strauss | H03K 17/302 327/143 |
| 7,105,982 B1 | 9/2006 | Hagood, IV et al. | |
| 2005/0184761 A1* | 8/2005 | Isomura | H03K 3/02337 327/77 |
| 2013/0066594 A1 | 3/2013 | Ludlow et al. | |

* cited by examiner

CIRCUIT FOR COMPARING A VOLTAGE WITH A THRESHOLD

CROSS-REFERENCE TO THE RELATED APPLICATIONS

This application claims the priority benefit of French Patent application number 14/62427, filed on Dec. 15, 2014, the contents of which is hereby incorporated by reference in its entirety to the maximum extent allowable by law.

BACKGROUND

The present disclosure generally relates to electronic circuits, and more particularly to a circuit for comparing a voltage with a threshold. It particularly aims at a circuit having a low power consumption, which may particularly be used in an ambient energy harvesting generator. It further aims at an ambient energy harvesting generator comprising such a circuit.

Discussion of the Related Art

To power electronic systems having a low power consumption, it has been provided to use generators capable of converting energy available in the system environment, for example, mechanical energy or thermal energy, into electrical energy.

Such a generator typically comprises an element for converting the ambient energy into electricity, for example, a piezoelectric element, and an electric power conversion circuit, placed downstream of the element for converting ambient energy into electricity, capable of transforming the electrical energy provided by the conversion element into electrical energy exploitable by an electronic system.

The electrical energy conversion circuit may comprise a circuit capable of comparing an input voltage with a threshold, and of providing an electric power supply to a load when the input voltage exceeds this threshold.

A circuit capable of comparing an input voltage with a threshold and of providing a power supply voltage to a load when the input voltage exceeds the threshold is here more specifically considered, this circuit requiring no power supply other than the input voltage for its operation.

SUMMARY

An embodiment provides such a circuit having a decreased electric power consumption as compared with existing circuits.

An embodiment provides an ambient energy harvesting generator comprising such a circuit.

Thus, an embodiment provides a circuit for comparing a voltage with a threshold, comprising: first and second nodes of application of said voltage; a first branch comprising a first transistor in series with a first resistor between the first and second nodes; a second branch parallel to the first branch, comprising second and third resistors coupled in series, forming a voltage dividing bridge between the first and second nodes, the midpoint of the dividing bridge being coupled to a control node of the first transistor; and a third branch comprising a second transistor coupled in series with a resistive and/or capacitive element, between the control node of the first transistor and the first or second node, a control node of the second transistor being coupled to the junction point of the first transistor and of the first resistor.

According to an embodiment, the junction point of the second transistor and of the resistive and/or capacitive element, and the node of application of said voltage not coupled to the third branch, form nodes for providing an output voltage of the circuit, intended to be coupled to a load to be powered.

According to an embodiment, the circuit further comprises: between the junction point of the second transistor and of the resistive and/or capacitive element and the node of application of said voltage not coupled to the third branch, a fourth resistor; and between the node of application of said voltage not coupled to the third branch and a third node, a third transistor having a control node coupled to the junction point of the second transistor and of the resistive and/or capacitive element, wherein the node of application of said voltage coupled to the third branch and the third node form nodes for providing an output voltage of the circuit, intended to be coupled to a load to be powered.

According to an embodiment: the first transistor is an NPN bipolar transistor or an N-channel MOS transistor; the second transistor is a P-channel MOS transistor or a PNP bipolar transistor; in the first branch, the first resistor is on the side of the first node and the first transistor is on the side of the second node; and the third branch is located between the control node of the first transistor and the first node.

According to an embodiment: the first transistor is a PNP bipolar transistor or a P-channel MOS transistor; the second transistor is an N-channel MOS transistor or an NPN bipolar transistor; in the first branch, the first resistor is on the side of the second node and the first transistor is on the side of the first node; and the third branch is located between the control node of the first transistor and the second node.

According to an embodiment, the resistive and/or capacitive element is a resistor.

According to an embodiment, the resistive and/or capacitive element is an RC cell comprising a resistor and a capacitor.

According to an embodiment, at least one of the second and third resistors is a thermistor or an association of one or a plurality of resistors and of one or a plurality of thermistors.

Another embodiment provides an ambient energy harvesting generator, comprising: an element for converting ambient energy into electrical energy; a first capacitor capable of storing charges generated by said conversion element; and a first comparison circuit of the above-mentioned type, the first capacitor being coupled between the first and second nodes of the first comparison circuit.

According to an embodiment, the generator further comprises a circuit for inductively charging a second capacitor from the input voltage and the first comparison circuit.

According to an embodiment, the inductive charge circuit is a voltage step-down circuit.

According to an embodiment, the inductive charge circuit is a voltage step-up circuit.

According to an embodiment, the generator further comprises a second comparison circuit of the above-mentioned type, the second capacitor being coupled between the first and second nodes of the second comparison circuit.

The foregoing and other features and advantages will be discussed in detail in the following non-limiting description of specific embodiments in connection with the accompanying drawings.

DETAILED DESCRIPTION

Figure 1:
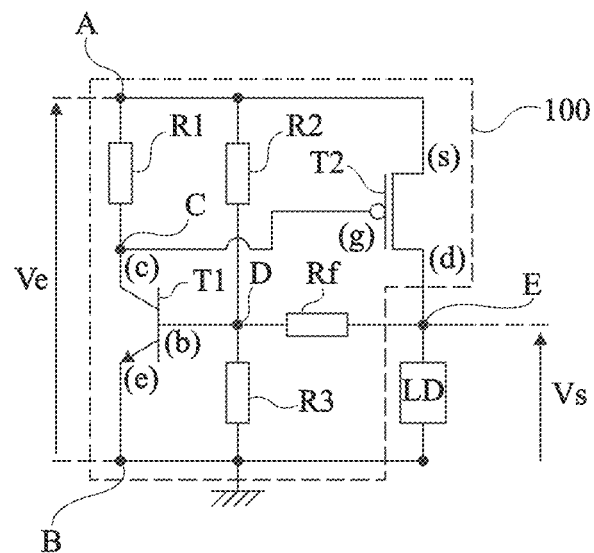
FIG. 1 is an electric diagram illustrating an embodiment of a circuit for comparing a voltage with a threshold.

The same elements have been designated with the same reference numerals in the different drawings. Further, in the present description, unless otherwise indicated, terms "approximately", "substantially", "around", "in the order of", etc., mean "to within 20%", or, concerning a zero voltage, "in the range from −300 to 300 mV", or, concerning a zero current, "in the range from −50 to 50 nA". Further, in the present description, term "connected" will be used to designate a direct electric connection, with no intermediate electronic component, for example, by means of a conductive track, and term "coupled" or term "linked" will be used to designate either a direct electric connection (then meaning "connected") or a connection via one or a plurality of intermediate components (resistor, capacitor, etc.).

FIG. 1 is an electric diagram illustrating an embodiment of a circuit for comparing an input voltage Ve with a threshold.

Comparison circuit 100 of FIG. 1 comprises a first branch comprising a resistor R1 and a transistor T1 series-connected between nodes A and B of application of voltage Ve. More particularly, in the shown example, resistor R1 has a first end coupled to node A and a second end coupled to a node C, and transistor T1 has a first conduction node coupled to node C and a second conduction node coupled to node B. In the shown example, transistor T1 is an NPN-type bipolar transistor, having its collector (c) coupled to node C and having its emitter (e) coupled to node B.

Circuit 100 further comprises a second branch parallel to the first branch, comprising two resistors R2 and R3 series-connected between nodes A and B. More particularly, in the shown example, resistor R2 has a first end coupled to node A and a second end coupled to a node D and resistor R3 has a first end coupled to node D and a second end coupled to node B. Resistors R2 and R3 form a voltage-dividing bridge. Node D, or midpoint of the dividing bridge, is coupled to a control node of transistor T1, that is, the base (b) of transistor T1 in the shown example.

Circuit 100 further comprises a third branch, comprising a transistor T2 in series with a resistive element Rf, between node A and node D. More particularly, in the shown example, resistor Rf has a first end coupled to node D and a second end coupled to a node E, and transistor T2 has a first conduction node coupled to node E and a second conduction node coupled to node A. In the shown example, transistor T2 is a P-channel MOS transistor having its source (s) coupled to node A and having its drain (d) coupled to node E. A control node of transistor T2, the gate thereof (g) in the present example, is coupled to node C.

Input voltage Ve may be a DC voltage provided by an electric power source (not shown), for example, the voltage across a capacitor of collection of electric charges generated by an element for converting ambient energy into electricity. Nodes E and B are nodes for providing an output voltage Vs of circuit 100. A load LD to be powered, for example, a wireless sensor (temperature, humidity, luminosity sensor, etc.), a light source for example using a light-emitting diode or an assembly of light-emitting diodes, etc. is connected between nodes E and B of circuit 100.

Circuit 100 operates as follows. When input voltage Ve is low, the voltage across resistor R3 of the dividing bridge is not sufficient to turn on transistor T1. Transistor T1 is thus off. The voltage across resistor R1, corresponding to the gate-source voltage of transistor T2 in this example, is then substantially zero. Transistor T2 is thus off. The current flowing through load LD is then substantially zero, and load LD is not powered. Output voltage Vs of circuit 100 is then approximately zero.

Resistive element Rf then contributes to lowering the voltage of node D by drawing it towards that of node E (then substantially equal to that of node B) and thus reinforces the non-conductive state of transistor T1.

When voltage Ve increases beyond a threshold $V_{SH}$, the voltage across resistor R3 reaches the turn-on threshold of transistor T1. Transistor T1 then turns on and a current flows through the branch comprising resistor R1 and transistor T1. The voltage across resistor R1, or source-gate voltage of transistor T2 in this example, then increase up to the turn-on threshold of transistor T2. Transistor T2 thus also turns on. Load LD is then powered, and output voltage Vs of circuit 100 becomes substantially equal to input voltage Ve (to within the voltage drop of transistor T2).

Resistive element Rf then tends to increase the voltage of node D by drawing it towards that of node E (then substantially equal to that of node A) and thus contributes to maintaining the conductive state of transistor T1.

When voltage Ve falls back under a threshold $V_{SB}$ lower than threshold $V_{SH}$, the voltage across resistor R3 is no longer sufficient to maintain transistor T1 in the on state. Transistor T1 thus turns off, and the voltage across resistor R1 becomes substantially zero, causing the turning-off of transistor T2. As a result, load LD is no longer powered, and output voltage Vs of circuit 100 becomes substantially zero.

The presence of resistor Rf, or feedback resistor, between nodes D and E, provides circuit 100 with a hysteresis operation, that is, its threshold $V_{SH}$ where it switches from the off state (Vs≈0) to the on state (Vs≈Ve) is higher than threshold $V_{SB}$ where it switches from the on state to the off state. This enables to avoid an unwanted oscillation between the powered mode and the non-powered mode of load LD, particularly in the case where the switching from the off state to the on state goes along with a strong current inrush into load LD.

Noting Von the turn-on voltage of transistor T1, that is, the voltage to be applied across resistor R3 to turn on transistor T1, thresholds $V_{SH}$ and $V_{SB}$ may be calculated as follows:

$$V_{SH} \approx Von * \frac{1/R3 + 1/R2 + 1/Rf}{1/R2} ; \text{ and}$$

$$V_{SB} \approx Von * \frac{1/R3 + 1/R2 + 1/Rf}{1/R2 + 1/Rf}.$$

The values of resistances R1, R2, R3, and Rf are preferably relatively high to limit the electric power consumption of circuit 100. As an example, resistance R1, resistance R2+R3 of the dividing bridge, and resistance Rf, are greater than 5 MΩ, and preferably greater than 50 MΩ. For example, resistance R1 is approximately 10 MΩ, resistance R2 is approximately 50 MΩ, resistance R3 is approximately 7 MΩ, and resistance Rf is approximately 150 MΩ.

As a variation, transistor T1 may be replaced with an N-channel MOS transistor having its source, its drain, and its gate respectively coupled to node B, to node C, and to node D. The use of a bipolar transistor however has the advantage of improving the accuracy of the switching thresholds, since the turn-on voltage of a bipolar transistor is generally less sensitive to temperature variations and to manufacturing dispersions than that of a MOS transistor.

Further, transistor T2 may be replaced with a PNP-type bipolar transistor having its emitter, its collector, and its base respectively coupled to node A, to node E, and to node C. The use of a MOS transistor however has the advantage of limiting the consumption of circuit 100, a bipolar transistor indeed consuming a base current in the on state.

Figure 2:
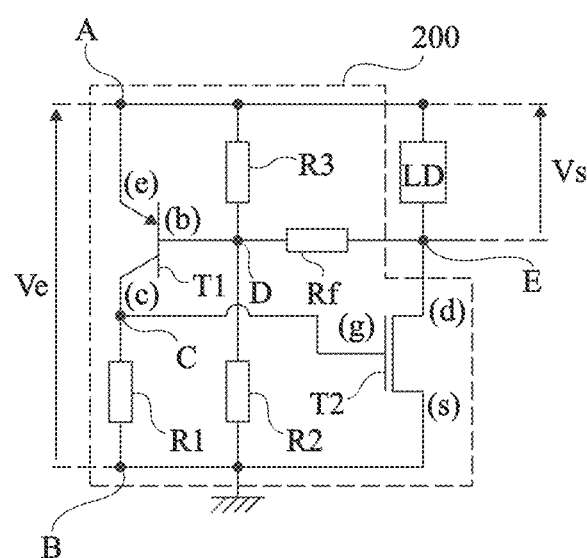
FIG. 2 is an electric diagram illustrating an alternative embodiment of a circuit for comparing a voltage with a threshold.

FIG. 2 is an electric diagram illustrating an alternative embodiment of a circuit for comparing an input voltage Ve with a threshold. Comparison circuit 200 of FIG. 2 substantially comprises the same elements as circuit 100 of FIG. 1, and differs from circuit 100 of FIG. 1 essentially in that the conductivity types of transistors T1 and T2 are inverted, and in that the positions of transistor T1 and of resistor R1 are interchanged, in that the positions of resistors R2 and R3 are interchanged, and in that the positions of transistor T2 and of load LD are interchanged. In other words, in circuit 200, the conduction nodes of transistor T1 are coupled to nodes A and C, the ends of resistor R1 are coupled to nodes C and B, the ends of resistor R2 are coupled to nodes D and B, the ends of resistor R3 are coupled to nodes D and A, the conduction nodes of transistor T2 are coupled to nodes E and B, the ends of resistor Rf are coupled to nodes D and E, the control node of transistor T1 is coupled to node D, the control node of transistor T2 is coupled to node C, and load LD is connected between nodes A and E, which form the nodes for providing output voltage Vs of circuit 200. As in the example of FIG. 1, input voltage Ve is applied between nodes A and B.

In the shown example, transistor T1 is a PNP bipolar transistor having its emitter (e) coupled to node A, its collector (c) coupled to node C, and its base (b) coupled to node D, and transistor T2 is an N-channel MOS transistor having its source (s) coupled to node B, its drain (d) coupled to node E, and its gate (g) coupled to node C.

Circuit 200 of FIG. 2 operates as follows. When input voltage Ve is low, the voltage across resistor R3 of the dividing bridge is not sufficient to turn on transistor T1. Transistor T1 is thus off. The voltage across resistor R1, corresponding to the gate-source voltage of transistor T2 in this example, is then substantially zero. Transistor T2 is thus off. The current flowing through load LD is then substantially zero, and load LD is not powered. Output voltage Vs of circuit 200 is then approximately zero.

Resistive element Rf then contributes to raising the voltage of node D by drawing it towards that of node E (then substantially equal to that of node A) and thus reinforces the non-conductive state of transistor T1.

When voltage Ve increases beyond a threshold $V_{SH}$, the voltage across resistor R3 reaches the turn-on threshold of transistor T1. Transistor T1 then turns on and a current flows through the branch comprising resistor R1 and transistor T1. The voltage across resistor R1, or gate-source voltage of transistor T2 in this example, then increases up to the turn-on threshold of transistor T2. Transistor T2 thus also turns on. Load LD is then powered, and output voltage Vs of circuit 200 then becomes substantially equal to input voltage Ve (to within the voltage drop of transistor T2).

Resistive element Rf then tends to decrease the voltage of node D by drawing it towards that of node E (then substantially equal to that of node B) and thus contributes to maintaining the conductive state of transistor T1.

When voltage Ve falls back under a threshold $V_{SB}$ lower than threshold $V_{SH}$, the voltage across resistor R3 is no longer sufficient to maintain transistor T1 in the on state. Transistor T1 turns off, and the voltage across resistor R1 becomes substantially zero, causing the turning-off of transistor T2. As a result, load LD is no longer powered, and output voltage Vs of circuit 200 becomes substantially zero.

Thus, circuit 200 has an operation identical or similar to that of circuit 100 of FIG. 1, and has, like circuit 100, a hysteresis operation, where high and low switching thresholds $V_{SH}$ and $V_{SB}$ of the circuit can be calculated by the above-mentioned formulas in relation with the example of FIG. 1 (Von designating, as in the example of FIG. 1, the voltage to be applied across resistor R3 to turn on transistor T1).

As a variation, transistor T1 of circuit 200 may be replaced with a P-channel MOS transistor having its source, its drain, and its gate respectively coupled to node A, to node C, and to node D. The use of a bipolar transistor however has, as in the example of FIG. 1, the advantage of improving the accuracy of switching thresholds $V_{SH}$ and $V_{SB}$.

Further, transistor T2 of circuit 200 may be replaced with an NPN-type bipolar transistor having its emitter, its collector, and its base respectively connected to node B, to node E, and to node C. However, as in the example of FIG. 1, the use of a MOS transistor has the advantage of decreasing the electric power consumption of circuit 200.

Figure 3:
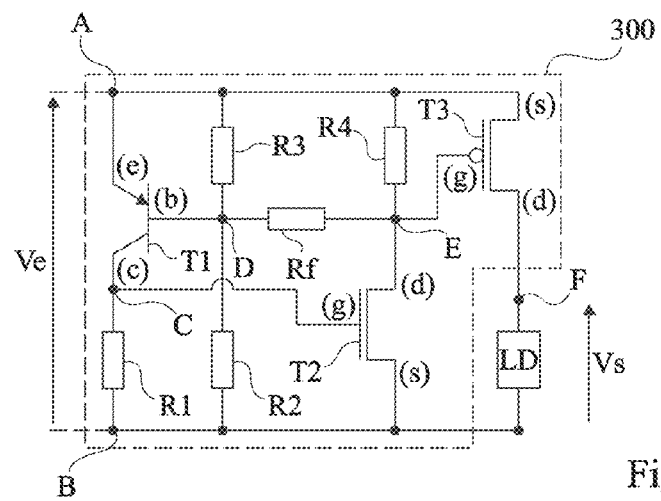
FIG. 3 is an electric diagram illustrating another alternative embodiment of a circuit for comparing a voltage with a threshold.

FIG. 3 is an electric diagram illustrating another alternative embodiment of a circuit for comparing an input voltage Ve with a threshold. Comparison circuit 300 of FIG. 3 comprises the same elements as circuit 200 of FIG. 2, substantially arranged in the same way as in the example of FIG. 2, and differs from circuit 200 of FIG. 2 in that it further comprises a resistor R4 having its ends respectively coupled to nodes A and E, and a transistor T3 having its conduction nodes respectively coupled to node A and to node F, and having its control node coupled to node E.

Resistor R4 preferably has a value smaller than Rf, for example in the range from 5% to 20% of the value of resistor Rf, for example, in the order of 10% of the value of resistor Rf, to enable to turn off transistor T3 when transistor T2 is non-conductive.

In the shown example, transistor T3 is a P-channel MOS transistor having its source coupled to node A, having its drain coupled to node F, and having its gate coupled to node E.

As in the examples of FIGS. 1 and 2, input voltage Ve is applied between nodes A and B. However, in the example of FIG. 3, load LD is connected between nodes F and B, which form the nodes for providing output voltage Vs of the circuit.

Circuit 300 operates as follows. When input voltage Ve is low, the voltage across resistor R3 of the dividing bridge is not sufficient to turn on transistor T1, which is thus off. The voltage across resistor R1 is then substantially zero, whereby transistor T2 is off. The voltage across resistor R4 is then lower than the switching threshold of transistor T3, and transistor T3 is off. Load LD is then not powered, and output voltage Vs of circuit 300 is approximately zero.

Resistive element Rf then contributes to raising the voltage of node D by drawing it towards that of node E (then substantially equal to that of node A) and thus reinforces the non-conductive state of transistor T1.

When voltage Ve increases beyond a threshold $V_{SH}$, the voltage across resistor R3 reaches the turn-on threshold of transistor T1, which then turns on. A current then flows through the branch comprising resistor R1 and transistor T1, and the voltage across resistor R1 increases up to the turn-on threshold of transistor T2, which turns on. The voltage across resistor R4 then increases up to the turn-on threshold of transistor T3, which turns on. Load LD is thus powered, and output voltage Vs of circuit 300 becomes substantially equal to input voltage Ve (to within the voltage drop of transistor T3).

Resistive element Rf then tends to decrease the voltage of node D by drawing it towards that of node E (then substantially equal to that of node B) and thus contributes to maintaining the conductive state of transistor T1.

When voltage Ve falls back under a threshold $V_{SB}$ lower than threshold $V_{SH}$, the voltage across resistor R3 is no longer sufficient to maintain transistor T1 in the on state. The turning-off of transistor T1 then causes that of transistor T2, and then that of transistor T3.

Thus, circuit 300 of FIG. 3 has, as in the previous examples, a hysteresis-type operation, switching thresholds $V_{SH}$ and $V_{SB}$ being the same as in the example of FIG. 2, with the difference that term Rf in the above-mentioned calculation formula should be replaced with Rf+R4.

As a variation, transistor T3 may be replaced with a PNP-type bipolar transistor, having its emitter coupled to node A, having its collector coupled to node F, and having its base coupled to node E. The use of a MOS transistor however has the advantage of decreasing the electric power consumption of circuit 300.

An advantage of the embodiment of FIG. 3 is that load LD has a power supply node coupled to ground (node B), which provides a robust control and avoids unwanted switchings due to parasitic transient signals.

It should be noted that a complementary alternative embodiment of circuit 300 of FIG. 3 may be obtained by inverting the conductivity types of transistors T1, T2, and T3. This alternative embodiment has not been shown and will not be detailed, but directly follows from the previous examples. As an example, this variation may be obtained by adding to circuit 100 of FIG. 1 a resistor R4 between nodes E and B, and an N-channel MOS transistor or an NPN-type bipolar transistor T3 between node B and a node F, the control node of transistor T3 being coupled to node E. Load LD is then connected between nodes A and F, which form the nodes for delivering output voltage Vs of the circuit.

Figure 4:
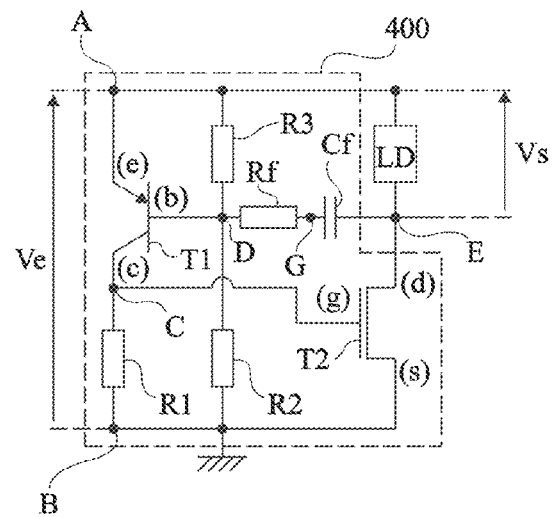
FIG. 4 is an electric diagram illustrating another alternative embodiment of a circuit for comparing a voltage with a threshold.

FIG. 4 is an electric diagram illustrating another alternative embodiment of a circuit for comparing an input voltage Ve with a threshold. Comparison circuit 400 of FIG. 4 comprises substantially the same elements as circuit 200 of FIG. 2, and differs from circuit 200 essentially in that, in circuit 400, resistor Rf is replaced with a series association of a resistor Rf and of a capacitor Cf coupling nodes D and E. More specifically, in the shown example, resistor Rf has a first end coupled to node D and a second end coupled to a node G, and capacitor Cf has a first electrode coupled to node G and a second electrode coupled to node E. Resistor Rf and capacitor Cf may however be interchanged. In other words, in the example of FIG. 4, resistor Rf is replaced with an RC cell.

The operation of circuit 400 is similar to that of circuit 200 of FIG. 4, but for the fact that circuit 400 does not have a hysteresis operation but has a single switching threshold, corresponding to threshold $V_{SH}=V_{SB}$ of the circuit of FIG. 2 in the case where value Rf of the calculation formulas mentioned in relation with FIG. 2 is infinite (that is, $V_{SH}=V_{SB}=\text{Von}*R2*(1/R3+1/R2))$. After a switching from the off state to the on state, circuit 400 remains on for a time period τ particularly depending on the values of resistance Rf and of capacitance Cf.

Thus, when input voltage Ve is low, circuit 400 is off and load LD is not powered. Output voltage Vs of circuit 400 is then substantially zero.

When voltage Ve increases beyond threshold $V_{SH}$, output voltage Vs of circuit 400 becomes substantially equal to input voltage Ve (to within the voltage drop of transistor T2), and load LD is powered.

When circuit 400 switches on, the falling edge of the voltage between nodes E and B is transmitted to node G via capacitor Cf, which tends to lower the voltage of node D and thus contributes to maintaining transistor T1 in the on state as long as capacitor Cf is not discharged. Circuit 400 remains conductive and powers load LD for a time period τ particularly adjustable by the value of resistance Rf and by the value of capacitance Cf.

At the end of this power supply time period, if voltage Ve has fallen back under threshold $V_{SH}$, circuit 400 turns off and stops powering load LD. Output voltage Vs is then substantially zero.

Although circuit 400 of FIG. 4 does not have a hysteresis operation, the presence of the RC cell between nodes D and E enables, by guaranteeing a minimum time period of power supply of load LD, to avoid an unwanted oscillation between the powered mode and the non-powered mode of load LD, particularly in the case where the switching from the off state to the on state goes along with a strong current inrush in load LD.

As a non-limiting example, in the example of FIG. 4, the value of resistance Rf is in the range from 100 kΩ to 10 MΩ, for example, in the order of 1 MΩ, and the capacitance of capacitor Cf is in the range from 1 nF to 100 nF, for example, in the order of 10 nF.

As a variation, the RC cell may be replaced with a single capacitance, or with an RC cell of another type, for example, a parallel association of a resistor Rf and of a capacitor Cf. Further, an additional resistive element (not shown) and/or an additional capacitive element (not shown) may be coupled in parallel with the RC cell, between nodes D and E.

It should be noted that the alternative embodiment of FIG. 4 is compatible with all the previously-described examples of comparison circuits, that is, in each of the circuits described in relation with FIGS. 1, 2, and 3, resistor Rf may be replaced with an RC cell, or with a parallel association of an RC cell and of a resistive element and/or a capacitive element.

Further, in each of the examples of FIGS. 1 to 4, the comparison circuit may further comprise a discharge resistor, not shown, between the nodes for providing output voltage Vs, in parallel with load LD. The provision of such a discharge resistor is particularly advantageous when load LD is a light-emitting diode or an association of a plurality of light-emitting diodes, or comprises capacitive or inductive elements, the discharge resistor then enabling to taking voltage Vs faster back to zero on switching of the circuit from the on state to the off state. As a non-limiting example, the discharge resistor may have a resistance in the range from 10 kΩ to 5 MΩ, for example, in the order of 100 kΩ.

Further, in each of the examples of FIGS. 1 to 4, to decrease the influence of temperature on the switching threshold(s) of the comparison circuit, one and/or the other of resistors R2 and R3 of the voltage dividing bridge (preferably, resistor R3) may be replaced with a thermistor, or with a series and/or parallel association comprising one or a plurality of resistors and one or a plurality of thermistors, selected to compensate for the temperature drift of turn-on voltage Von of transistor T1 (to maintain the switching thresholds of the circuit substantially independent from temperature).

An advantage of the comparison circuits described in relation with FIGS. 1 to 4 is their very low electric power consumption, which makes their use particularly advantageous in systems having low energy resources, particularly in ambient energy harvesting generators.

Figure 5:
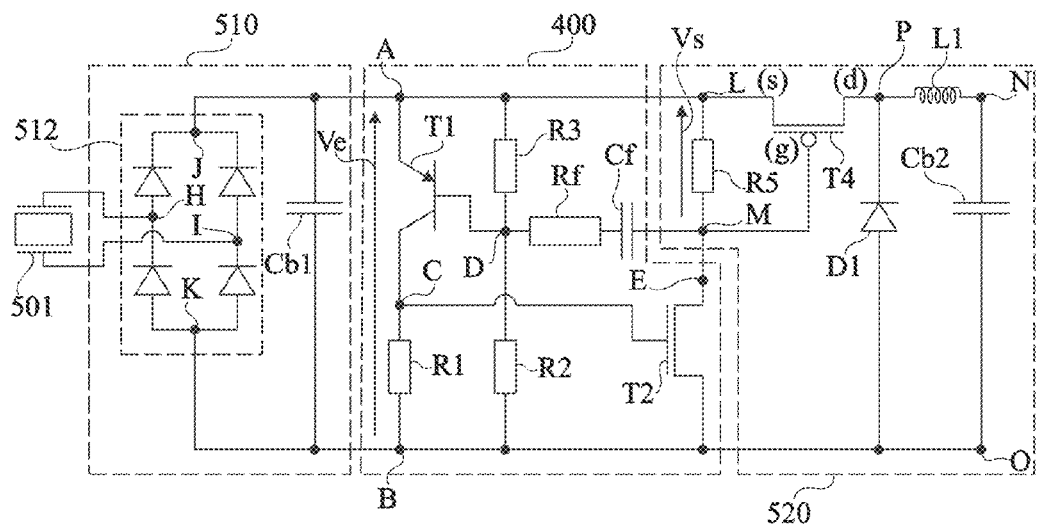
FIG. 5 is an electric diagram illustrating an embodiment of an ambient energy harvesting generator.

FIG. 5 is an electric diagram illustrating an embodiment of an ambient energy harvesting generator comprising a circuit for comparing a voltage with a threshold of the type described in relation with FIGS. 1 to 4.

The generator of FIG. 5 comprises an element 501 for converting ambient energy into electricity, for example, a piezoelectric conversion element.

The generator of FIG. 5 further comprises a first circuit 510 for shaping the electrical energy generated by element 501. In the shown example, circuit 510 comprises a voltage rectification circuit 512 and a capacitor Cb1 for storing the electrical energy generated by element 501. Element 501 is connected between input nodes H and I of rectifying circuit 512, which form input nodes of circuit 510, and capacitor Cb1 is connected between output nodes J and K of rectifying circuit 512, which form output nodes 510. More particularly, in the shown example, rectifying circuit 512 is a diode bridge comprising a first branch of two diodes series-connected between nodes K and J and, in parallel with the first branch, a second branch of two diodes series-connected between nodes K and J, the four diodes of the bridge all having the same conductivity direction, that is, each diode has its anode on the side of node K and its cathode on the side of node J. In this example, the midpoint of the first branch is coupled to node H, and the midpoint of the second branch is coupled to node I.

The generator of FIG. 5 further comprises a circuit for comparing a voltage with a threshold of the type described in relation with FIGS. 1 to 4, circuit 400 of FIG. 4 in the present example. Output nodes J and K of conversion circuit 510 are respectively coupled to input nodes A and B of comparison circuit 400.

The generator of FIG. 5 further comprises, at the output of comparison circuit 400, a circuit 520 for inductively charging a second capacitor Cb2, having a capacitance greater than that of capacitor Cb1. Circuit 520 comprises input nodes L and M respectively coupled to output nodes A and E of circuit 400, and output nodes N and O, capacitor Cb2 being connected between nodes N and O. In this example, node O is coupled to node B of comparison circuit 400.

Circuit 520 is a voltage step-down circuit (of buck converter type), that is, the voltage that it provides across capacitor Cb2 is smaller than the input voltage applied between nodes L and O of circuit 520.

Circuit 520 comprises a resistor R5 having a first end coupled to node L and having a second end coupled to node M, and a transistor T4 having a first conduction node coupled to node L, having a second conduction node coupled to a node P, and having a control node coupled to node M. In this example, transistor T4 is a P-channel MOS transistor having its source (s) and drain (d) regions respectively coupled to nodes L and P, and having its gate (g) coupled to node M. Circuit 520 further comprises an inductance L1 having a first end coupled to node P and having a second end coupled to node N, and a diode D1, or free wheel diode of the power circuit, having its anode coupled to node O and having its cathode coupled to node P.

A load to be powered (not shown) may be connected to output nodes N and O of circuit 520, which form, in this example, output nodes of the generator.

The generator of FIG. 5 operates as follows. Element 501 for converting ambient energy into electricity and rectifying circuit 512 form an electric power source providing a current to capacitance Cb1, causing the appearing of a voltage Ve across capacitance Cb1, this voltage being itself applied to the input of comparison circuit 400.

When input voltage Ve provided across capacitor Cb1 is low, circuit 400 is off, and voltage Vs provided by circuit 400 across input resistor R5 of circuit 520 is approximately zero.

When input voltage Ve exceeds switching threshold $V_{SH}$ of circuit 400, output voltage Vs of circuit 400 becomes substantially equal to input voltage Ve (to within the voltage drop of transistor T2), which turns on transistor T4.

Circuit 400 then remains conductive for a time period τ particularly adjustable by the value of resistance Rf and by the value of capacitance Cf.

For the entire conduction time period of circuit 400, voltage Ve charges, through inductance L1, capacitor Cb2.

After time period τ, if voltage Ve has fallen back below threshold $V_{SH}$, circuit 400 turns off, and voltage Vs becomes zero until voltage Ve rises back above threshold $V_{SH}$. During the off period of circuit 400, free wheel diode D1 finishes transferring into capacitor Cb2 the residual energy present in inductance L1.

Thus, the generator of FIG. 5 enables to charge capacitor Cb2 by means of inductive circuit 520, from a capacitor Cb1 of smaller capacitance. This assembly avoids having to place a capacitor of large capacitance directly at the output of conversion element 501, which would degrade the efficiency of conversion element 501.

Figure 6:
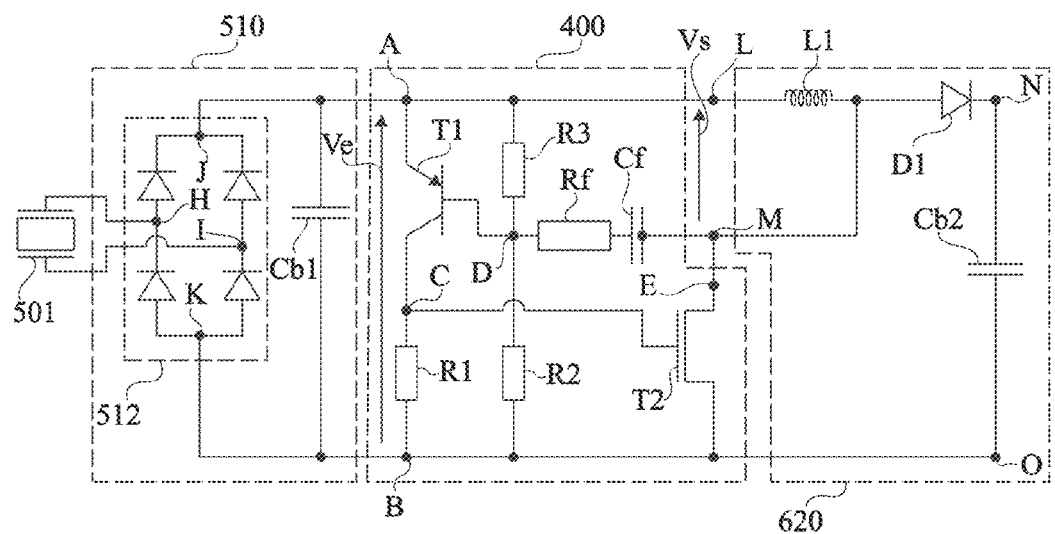
FIG. 6 is an electric diagram of an alternative embodiment of an ambient energy harvesting generator.

FIG. 6 is an electric diagram illustrating an alternative embodiment of an ambient energy harvesting generator comprising a circuit for comparing a voltage with a threshold of the type described in relation with FIGS. 1 to 4.

The generator of FIG. 6 differs from the generator of FIG. 5 essentially in that voltage step-down charge circuit 520 of the generator of FIG. 5 has been replaced with a voltage step-up charge circuit 620 (of boost converter type).

Circuit 620 comprises, as in the example of FIG. 5, input nodes L and M respectively coupled to output nodes A and E of comparison circuit 400, and output nodes N and O connected to the electrodes of a capacitor Cb2 having a capacitance greater than that of capacitor Cb1. In this example, node O is coupled to node B of comparison circuit 400. Circuit 620 comprises an inductance L1 having a first end coupled to node L and having its second end coupled to node M, and a diode D1 having its anode coupled to node M and having its cathode coupled to node N.

A load to be powered (not shown) may be connected to output nodes N and O of circuit 620, which form, in this example, output nodes of the generator.

The operation of the generator of FIG. 6 is identical or similar to that of FIG. 5, but for the fact that, in the example of FIG. 6, the output voltage of the generator provided across capacitor Cb2 is greater than the voltage across capacitor Cb1.

Figure 7:
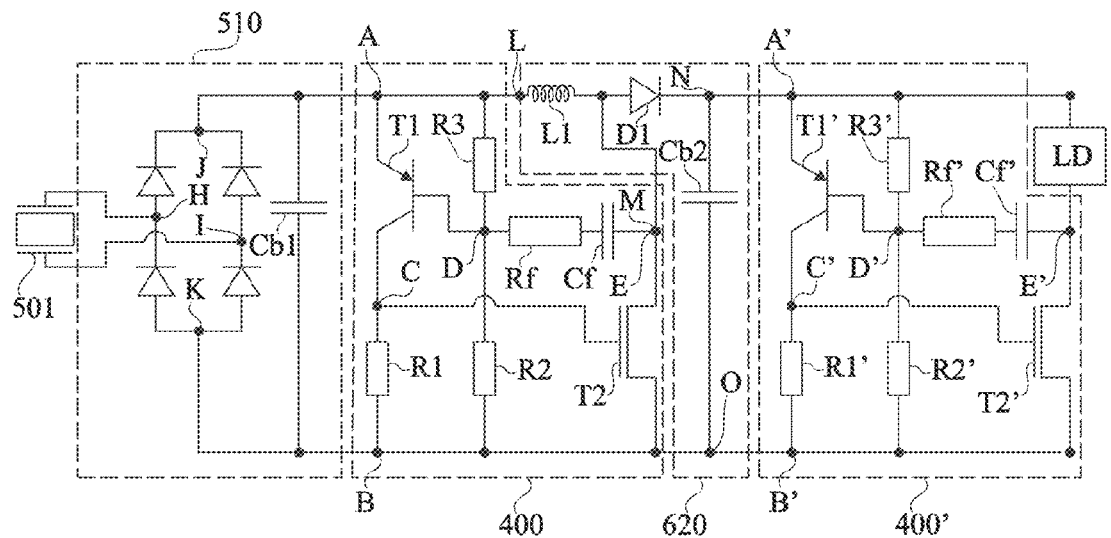
FIG. 7 is an electric diagram of another embodiment of an ambient energy harvesting generator.

FIG. 7 is an electric diagram illustrating another alternative embodiment of an ambient energy harvesting generator comprising a circuit for comparing a voltage with a threshold of the type described in relation with FIGS. 1 to 4.

The generator of FIG. 7 comprises the same elements as the generator of FIG. 6, arranged substantially in the same way, and further comprises a second voltage comparison circuit 400'. In this example, circuit 400' is identical to circuit 400, with component values which may be different, and all the elements of circuit 400' have been designated in FIG. 7 with the same reference numerals as in FIG. 4, completed with sign "'".

Input nodes A' and B' of circuit 400' are respectively coupled to output nodes N and O of circuit 620. A load LD to be powered is connected between output nodes A' and E' of circuit 400', which form the output nodes of the generator of FIG. 7.

Thus, in the example of FIG. 7, each time the voltage across capacitor Cb2 exceeds the switching threshold of comparison circuit 400', load LD is powered for a time period τ', with a voltage substantially equal to the voltage across capacitor Cb2 (to within the voltage drop of transistor T2').

Figure 8:
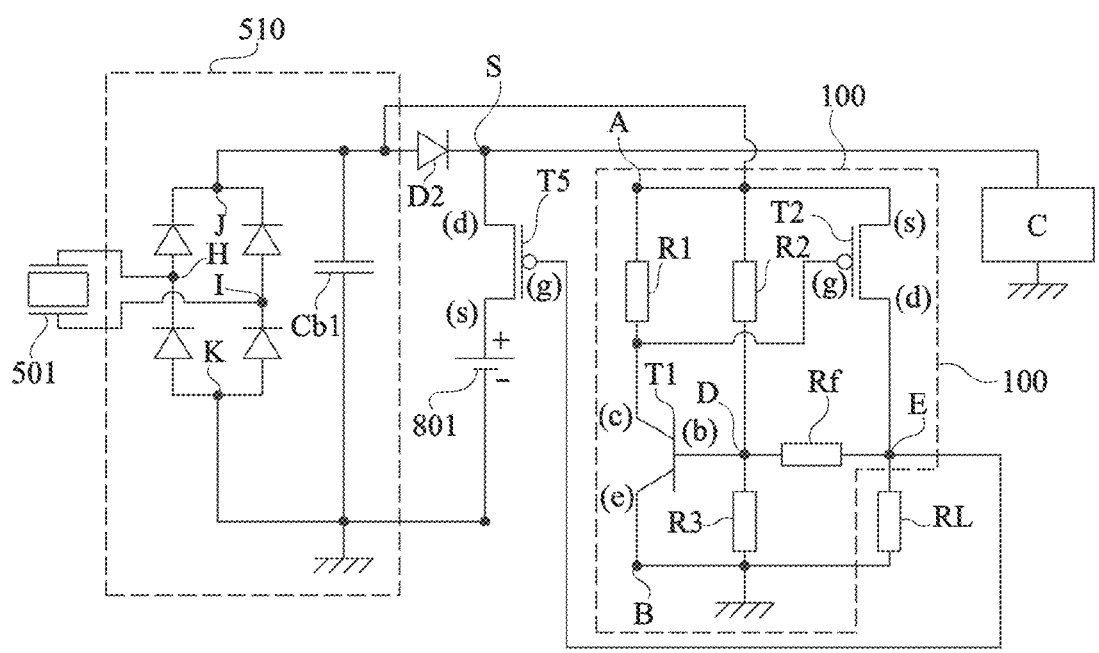
FIG. 8 is an electric diagram of another alternative embodiment of an ambient energy harvesting generator.

FIG. 8 is an electric diagram of another alternative embodiment of an ambient energy harvesting generator comprising a circuit for comparing a voltage with threshold of the type described in relation with FIGS. 1 to 4.

As in the examples of FIGS. 5, 6, and 7, the generator of FIG. 8 comprises an element 501 for converting ambient energy into electricity, and a circuit 510 for shaping the electric energy generated by element 501. These elements are for example identical to what has been previously described.

The generator of FIG. 8 further comprises a booster battery 801 intended to take over the power supply of a load C, for example, a sensor or a light source, when the converter of ambient energy into electricity does not provide enough energy. In this example, the battery is series-connected with a diode D2 and a P-channel MOS transistor T5 between output nodes J and K of circuit 510 (in parallel with capacitor Cb1). More particularly, in the shown example, the anode of diode D2 is connected to node J, the cathode of diode D2 is connected to the drain of transistor T5, the source of transistor T5 is connected to the positive terminal (+) of battery 801, and the negative terminal (−) of battery 801 is connected to node K.

The generator of FIG. 8 further comprises a circuit for comparing a voltage with a threshold of the type described in relation with FIGS. 1 to 4, circuit 100 of FIG. 1 in this example. Output nodes J and K of conversion circuit 510 are respectively connected to input nodes A and B of comparison circuit 100. The generator of FIG. 8 further comprises, at the output of comparison circuit 100, a resistor RL. In the shown example, the ends of resistor RL are respectively connected to output nodes E and B of circuit 100. Node E is further coupled (connected in the shown example) to the gate (g) of transistor T5.

Load C to be powered has its positive and negative power supply terminals respectively connected to junction point S of diode D2 and of transistor T5, and to node K.

In the discharged state, the voltage across capacitor Cb1 is substantially zero, and transistor T5 is on. Load C is then only powered by battery 801. When ambient energy is converted into electricity by element 501, capacitor Cb1 charges. When the voltage across capacitor Cb1 reaches the high switching threshold of the hysteresis comparator, circuit 100 switches, which turns off transistor T5. Load C is then powered by capacitor Cb1 via diode D2. If the voltage across capacitor Cb1 keeps on increasing, conversion circuit 510 recharges battery 801 via the intrinsic drain-source diode of transistor 801, while keeping on powering load C.

If the voltage across capacitor Cb1 reaches the low switching threshold of the hysteresis comparator, circuit 100 switches again, which turns on transistor T5. Load C is then only powered by battery 801, until the voltage across capacitor Cb1 reaches again the high switching threshold of the hysteresis comparator.

Specific embodiments have been described. Various alterations, modifications, and improvements will readily occur to those skilled in the art.

In particular, voltage comparison circuits of the type described in relation with FIGS. 1 to 4 may be used in other applications than ambient energy harvesting generators. As a non-limiting example, a circuit for comparing a voltage with a threshold of the type described in relation with FIGS. 1 to 4 may be used to monitor the charge and/or the discharge of a battery, for example, to trigger an alarm or a disconnect switch when a critical charge and/or discharge level is reached.

Further, for a use in an ambient energy harvesting generator, the described embodiments are not limited to the specific examples of generator architectures described in relation with FIGS. 5 to 7.

As a variation, an ambient energy harvesting generator may comprise the upstream portion of the generator of FIG. 5 only, without inductive charge 520, a load to be powered being then connectable between the output nodes of the comparison circuit.

Further, it will be within the abilities of those skilled in the art to adapt the example of FIG. 6 to replace inductive charge circuit 620 with a flyback-type charge circuit, that is, a circuit comprising a transformer enabling to charge capacitor Cb2 from voltage Ve.

Further, it will be within the abilities of those skilled in the art to adapt the examples of FIGS. 5 to 7 by replacing comparison circuits 400, 400' with comparison circuits of the type described in relation with FIGS. 1 to 3.

Further, in the example of FIG. 7, it is possible for the two voltage comparison circuits 400 and 400' not to be identical but to have different architectures, selected from among the architectures described in relation with FIGS. 1 to 4.

Further, a generator of the type described in relation with FIG. 7, comprising a plurality of cascaded inductive charge stages, separated by voltage comparison circuit of the type described in relation with FIGS. 1 to 4, may be provided.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for comparing a voltage with a threshold, comprising:
   first and second nodes of application of said voltage;
   a first branch comprising a first transistor coupled in series with a first resistor between the first and second nodes;
   a second branch parallel to the first branch, comprising second and third resistors coupled in series forming a voltage dividing bridge between the first and second nodes, the midpoint of the dividing bridge being coupled to a control node of the first transistor; and
   a third branch comprising: a second transistor having its conduction nodes respectively coupled to the first or second node and to a third node, and having a control node coupled to the junction point of the first transistor and of the first resistor; and a resistor or a capacitor or a series or parallel association of a resistor and of a capacitor, having its ends respectively coupled to the third node and to the control node of the first transistor.

2. The circuit of claim 1, wherein the third node and the first or second node of application of said voltage not coupled to the third branch form nodes for providing an output voltage of the circuit, intended to be coupled to a load to be powered.

3. The circuit of claim 1, further comprising:
between the third node and the first or second node of application of said voltage not coupled to the third branch, a fourth resistor; and
between the first or second node of application of said voltage not coupled to the third branch and a fourth node, a third transistor having a control node coupled to the third node,
wherein the first or second node of application of said voltage coupled to the third branch and the fourth node form nodes for providing an output voltage of the circuit, intended to be coupled to a load to be powered.

4. The circuit of claim 1, wherein:
the first transistor is an NPN bipolar transistor or an N-channel MOS transistor;
the second transistor is a P-channel MOS transistor or a PNP bipolar transistor;
in the first branch, the first resistor is on the side of the first node and the first transistor is on the side of the second node; and
the third branch is located between the control node of the first transistor and the first node.

5. The circuit of claim 1, wherein:
the first transistor is a PNP bipolar transistor or a P-channel MOS transistor;
the second transistor is an N-channel MOS transistor or an NPN bipolar transistor;
in the first branch, the first resistor is on the side of the second node and the first transistor is on the side of the first node; and
the third branch is located between the control node of the first transistor and the second node.

6. The circuit of claim 1, wherein the resistor or the capacitor or the series or parallel association of a resistor and of a capacitor is a resistor.

7. The circuit of claim 1, wherein the resistor or the capacitor or the series or parallel association of a resistor and of a capacitor is a series or parallel association of a resistor and of a capacitor.

8. The circuit of claim 1, wherein at least one of the second and third resistors is a thermistor or an association of one or a plurality of resistors and of one or a plurality of thermistors.

9. An ambient energy harvesting generator, comprising:
an element for converting ambient energy into electrical energy;
a first capacitor capable of storing charges generated by said conversion element; and
a first comparison circuit of claim 1, the first capacitor being coupled between the first and second nodes of the first comparison circuit.

10. The generator of claim 9, further comprising a circuit for inductively charging a second capacitor from the input voltage and the first comparison circuit.

11. The generator of claim 10, wherein the inductive charge circuit is a voltage step-down circuit.

12. The generator of claim 10, wherein the inductive charge circuit is a voltage step-up circuit.

13. The generator of claim 10, further comprising a second comparison circuit of claim 1, the second capacitor being coupled between the first and second nodes of the second comparison circuit.

14. The generator of claim 9, further comprising a diode, a transistor, and an electric booster battery coupled in series between the terminals of the first capacitor.

* * * * *

UNITED STATES PATENT AND TRADEMARK OFFICE
CERTIFICATE OF CORRECTION

PATENT NO. : 9,742,219 B2  
APPLICATION NO. : 14/970329  
DATED : August 22, 2017  
INVENTOR(S) : Jérôme Willemin et al.

Page 1 of 1

It is certified that error appears in the above-identified patent and that said Letters Patent is hereby corrected as shown below:

On the Title Page

The Applicant in item (71) and the Assignee in Item (73) is hereby amended as follows:

(71) Applicant: Commissariat à l'Énergie Atomique et aux Énergies Alternatives, Paris (FR)  
STMicroelectronics SA, Montrouge (FR)

(73) Assignee: Commissariat à l'Énergie Atomique et aux Énergies Alternatives, Paris (FR)  
STMicroelectronics SA, Montrouge (FR)  
STMicroelectronics (Crolles 2) SAS, Crolles (FR)

Signed and Sealed this  
Ninth Day of October, 2018

Andrei Iancu  
*Director of the United States Patent and Trademark Office*